United States Patent [19]
Omid-Zohoor et al.

[11] Patent Number: 6,011,272
[45] Date of Patent: Jan. 4, 2000

[54] SILICIDED SHALLOW JUNCTION FORMATION AND STRUCTURE WITH HIGH AND LOW BREAKDOWN VOLTAGES

[75] Inventors: Farrokh Omid-Zohoor, San Antonio, Tex.; Nader Radjy, Palo Alto, Calif.

[73] Assignee: Advanced Micro Devices, Inc., Sunnyvale, Calif.

[21] Appl. No.: 08/986,284

[22] Filed: Dec. 6, 1997

[51] Int. Cl.[7] ............................ H01L 23/48; H01L 23/52; H01L 29/40
[52] U.S. Cl. ............................ 257/44; 257/768; 257/757; 257/770
[58] Field of Search .................................. 257/757, 768, 257/770, 44

[56] References Cited

U.S. PATENT DOCUMENTS

| | | | |
|---|---|---|---|
| 4,629,520 | 12/1986 | Ueno et al. | 438/564 |
| 5,759,899 | 6/1998 | Saito | 438/303 |

FOREIGN PATENT DOCUMENTS

| | | | |
|---|---|---|---|
| 63-29983 | 2/1988 | Japan | 257/910 |

*Primary Examiner*—William Mintel
*Attorney, Agent, or Firm*—Foley & Lardner

[57] ABSTRACT

A method, and structure resulting therefrom, of forming a metal silicide at a shallow junction of a diode in a single crystalline substrate without encroaching on the shallow junction by forming a metal layer on the substrate over the junction followed by forming a layer of a silicon material which reacts with the metal faster than the silicon in the single crystal substrate. Titanium is the preferred metal and amorphous silicon is the preferred silicon layer and is of a thickness to react with most of the titanium. The two layers are rapid thermal annealed to form titanium silicide. A second rapid thermal anneal is performed which converts the majority of the C49 phase of the titanium silicide to a less resistive and a more stable and conductive C54 phase and causes a silicon epitaxial layer to form between silicon substrate and the titanium silicide. The method and resulting structure can be used with a conventional method of fabricating diodes with different or varying breakdown voltages and leakage currents.

7 Claims, 5 Drawing Sheets

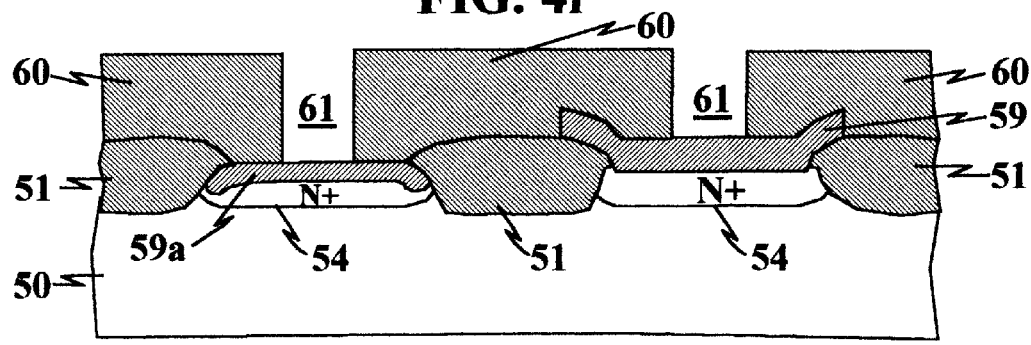
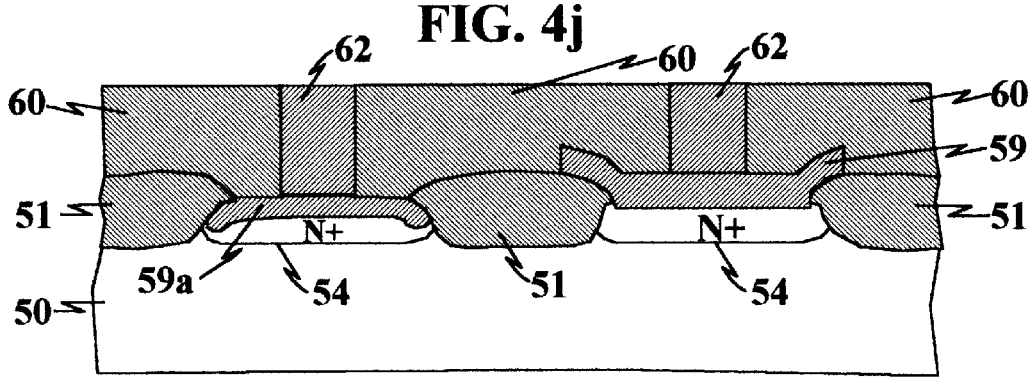

SILICIDED SHALLOW JUNCTION FORMATION AND STRUCTURE WITH HIGH AND LOW BREAKDOWN VOLTAGES

FIELD OF THE INVENTION

The present invention relates to fabricating integrated circuits and, more specifically, to fabricating silicided shallow junctions of diodes with the same or different breakdown voltages and the resultant diode structure.

BACKGROUND OF THE INVENTION

In the conventional self aligned silicides fabrication, which has been given the name "salicide process", the silicidation process usually is carried out after the formation of the junctions. In the case of diodes, the silicidation process is after the formation of the diode junction. As for NMOS, PMOS, CMOS and BiCMOS, the silicidation process is after the source/drain implant and anneal and, in the case of bipolar, the silicidation process is after the emitter to base junction formation and anneal. For example, in the conventional CMOS fabrication process, after the gate definition, LDD implant, spacer formation and source/drain implant screen oxide, the source and drains are implanted and annealed. Following removal of the screen oxide and a clean process, titanium or other refractory metal or Group VIII metals is deposited and annealed to form the silicide, such as titanium silicide. During the silicidation process with titanium, the silicon is the moving species and, as the silicide is formed, the silicon below the original silicon surface is consumed. It is well established that 1 angstrom of titanium (Ti) will react with 2.27 angstroms of crystalline silicon to produce 2.4 angstroms of titanium silicide ($TiSi_2$).

Advanced high performance submicron diode, NMOS, PMOS, CMOS, biCMOS and bipolar integrated circuits require further down scaling of the devices in the lateral and vertical directions. However, as the gate length is scaled down, the vertical dimensions of the devices, such as gate oxide thickness and junction depth need to be scaled down accordingly for optimum performance of the devices and to alleviate short channel effects. However, as vertical and laterally scaling of these devices continues, the fabrication of very shallow junctions create additional challenges due to the very low implant energy required to fabricate very shallow junctions and the higher parasitic source and drain resistance introduced by the shallow junctions, as well as excessive off leakage current. To reduce the parasitic resistances, these advanced integrated circuits employ silicides at the shallow junctions and thereby increase device speed and performance. However, a major portion (~one-half) of the originally implanted shallow junction in the silicon substrate is consumed by the silicidation in the conventional salicidation process and such consumption of the silicon substrate during silicidation degrades the integrity of the shallow junctions and sets a lower limit for the junction depth. A similar situation exists in using the conventional method in fabricating silicided shallow junction emitters in bipolar or biCMOS integrated circuits.

However, in some diode applications, the conventional method of fabricating silicided shallow junction diodes can not be used to fabricate diodes with different breakdown voltages without complicating the fabrication process.

SUMMARY OF THE INVENTION

Accordingly, it is an object of the present invention to provide a method of fabricating diodes in an integrated circuit with shallow junctions having the same, different or varying breakdown voltages.

A further object of the present invention is to provide a method of fabricating diodes with different breakdown voltages without complicating the fabrication process.

Another object of the present invention is to provide an integrated circuit fabrication method diodes which permits taking advantage of the conventional method of fabricating silicided junction diodes to form diodes with low breakdown voltages.

A further object of the present invention is to provide an integrated circuit structure including diodes having silicided shallow junctions with the same, different or varying breakdown voltages.

In accordance with the present invention, a method of fabricating an integrated circuit including a diode in and on a single crystal silicon substrate comprising, after the formation of a shallow junction for the diode, the steps of: depositing a metal layer capable of reacting with silicon to form a silicide at a shallow junction of a diode; depositing on the metal a layer of a silicon material which reacts with a metal to form a silicide at a faster rate than silicon in a single crystal silicon substrate; reacting the silicon of the silicon material with the metal to form a metal silicide over the shallow junction of the diode, whereby the breakdown voltage of the fabricated diode is high. Preferably, the metal is a refractory metal or a Group VIII metal and, most preferably, the metal is titanium and the silicon material is amorphous ($\alpha$) silicon, both of which are sputter, preferably in situ, deposited. The silicon material is of a thickness so that the majority, if not almost all of the metal, reacts with the silicon of the deposited silicon material and at least only a small amount of the silicon of the silicon substrate is consumed during the silicide reaction. In accordance with another aspect of the present invention, a method of fabricating an integrated circuit including a first diode and a second diode in and on a single crystal silicon substrate comprising, after the formation of a shallow junction for each of the first and second diodes, the steps of: depositing a metal layer capable of reacting with silicon to form a silicide at a shallow junction for a first diode and at a shallow junction for a second diode, depositing on the metal a layer of a silicon material which reacts with a metal to form a silicide at a faster rate than silicon in the silicon substrate, forming a masking layer over the silicon layer and metal layer at the shallow junction for said first diode, removing the silicon layer from the unmasked areas, removing the masking layer and reacting the silicon of the silicon material with the metal to form a metal silicide over the shallow junction for the first diode and reacting the silicon of the single crystal silicon substrate with the metal to form a metal silicate at the shallow junction of said second diode, whereby the breakdown voltage of the first diode is high and the breakdown voltage of the second diode is low. According to another aspect of the present invention, the deposited silicon material can be doped and the doping can be used as a parameter to control the amount of silicon contributed from the silicon material. According to a further aspect of the present invention, an integrated circuit on and in a single crystal silicon substrate having an upper surface comprising: a plurality of diodes, each of said diodes having a shallow junction; and a metal silicide layer disposed over each of said shallow junctions with at least one metal silicide layer being positioned at or above the upper surface of said silicon substrate. Another aspect of the present invention comprises an epitaxial silicon layer disposed between the upper surface of the silicon substrate and the metal silicide.

BRIEF DESCRIPTION OF THE DRAWINGS

The foregoing and other objects, aspects and advantages will be better understood from the following detailed description of preferred embodiments of the invention with reference in the drawings, in which:

FIG. 4i is a cross-sectional view of the portion of the semiconductor substrate of FIG. 4h with an interlevel insulating layer having contact openings to the metal silicide of the active regions.

FIG. 4j is a cross-sectional view of the portion of the semiconductor substrate of FIG. 4i with the contact openings filled with a conductive material.

DETAILED DESCRIPTION OF THE PREFERRED EMBODIMENTS OF THE INVENTION

Figure 1A:
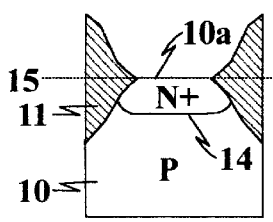
FIGS. 1a, 1b and 1c are cross-sectional views of the prior art method of forming a refractory metal silicide at the surface of an active region of a diode.
Figure 1B:
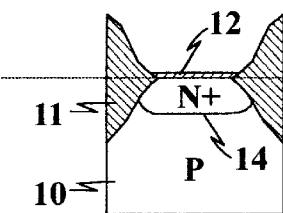
Figure 1C:
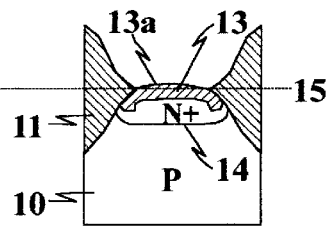

Referring now to the prior art drawings of FIGS. 1(a)–(c), FIG. 1(a) shows the single crystalline P doped silicon substrate 10 with LOCOS isolation 11 and N-type impurities to form a N+/P shallow junction 14 with the surface 10a of the substrate 10 exposed. In FIG. 1(b), a refractory metal, such as a titanium layer 12, is deposited on the exposed surface 10a and in FIG. 1(c) titanium silicide 13 is formed by reacting the titanium 12 with the silicon of the silicon substrate 10. It will be noted that the shape of the titanium silicide 13 is humped in the center and is above the original substrate surface 10a as evidenced by the dashed line 15 drawn through FIGS. 1(a)–(c). More importantly, it will be noted that the major growth of the titanium silicide is into the silicon substrate, again as evidenced by the dashed line 15, and the greatest growth is at the edges where the N+ impurities are in lower concentration than in the center of the active region. Because of this shape of the titanium silicide, the shallow junction becomes ever more shallow and the result is a low breakdown voltage diode.

Figure 2A:
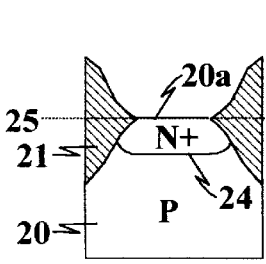
FIGS. 2a, 2b and 2c are cross-sectional views of method of the present invention of forming a refractory metal silicide at the surface of an active region of a diode.
Figure 2B:
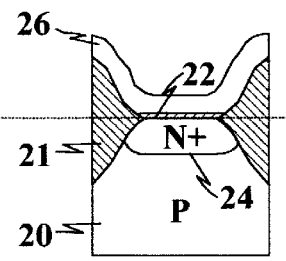
Figure 2C:
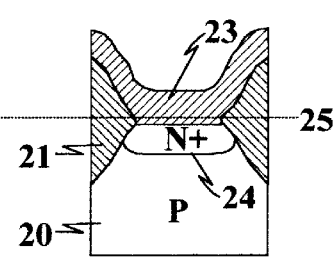

Turning now to FIGS. 2(a)–(c), FIG. 2(a) again shows the single crystalline P doped silicon substrate 20 with LOCOS isolation 21 and N-type impurities to form a N+/P shallow junction 24 with the surface 20a of the substrate 20 exposed. In FIG. 2(b), a refractory metal, such as a titanium, or a Group VII metal layer 22 is deposited on the exposed surface 20a followed by the deposition on the titanium layer 22 of a layer of a silicon containing material 26, such as amorphous silicon which silicides at a faster rate than single crystal silicon. In FIG. 2(c), titanium silicide 23 is formed by reacting the titanium 22 with the silicon containing material 26. In the prior art silicidation method with the single crystal substrate of FIGS. 1(a)–(c), the silicon atoms migrate towards the titanium atoms where they react and form $TiSi_x$ (phase C49). The silicon atoms diffuse towards the titanium atoms through the crystal vacancies or regions which are referred to as the centers for nucleation. Because, in contrast to single crystalline silicon, amorphous silicon has many more centers of nucleation and silicides at a much faster rate. Silicon atoms from the amorphous silicon layer 26 and silicon atoms from the single crystal substrate 10 migrate from the top and bottom and bottom to top, respectively, to the titanium layer 24. The reaction stops when all of the titanium layer 24 is reacted. Since the amorphous silicon silicides much faster than the single crystal substrate, most of the silicidation occurs upward away from the original silicon surface 20a, as evidenced by dashed line 25, and only a very small portion of shallow junction is consumed, unlike the prior art method of FIGS. 1(a)–(c). It is important to note that the silicide formed from single crystal silicon, as stated above, is C54 phase and the silicide formed from the amorphous silicon is also C54 phase after a second anneal. With a sufficiently thick amorphous silicon layer 26 so as not to be totally consumed by the silicidation, silicon atoms from the amorphous silicon layer can migrate through the titanium silicide 23 to the single crystal silicon substrate to form a solid phase epitaxy layer as shown slightly below the dashed line 25 in FIG. 2(c). Accordingly, because the titanium silicide 23 is at or above the original silicon surface 10a, the shallow junction is not consumed and the result is a high breakdown voltage for the diode.

Figure 3A:
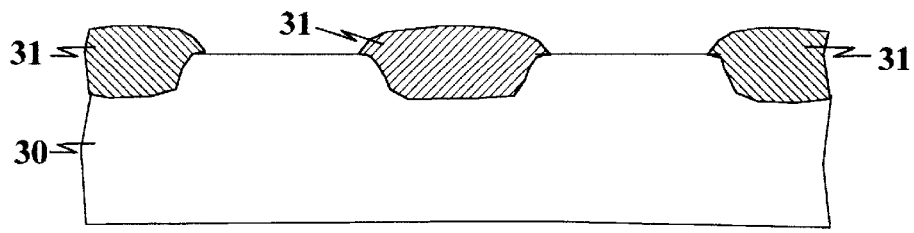
FIG. 3a is a cross-sectional view of the portion of a semiconductor substrate with isolation regions on opposite sides of a pair of active regions for diode formation as the starting point in describing the method of the present invention.
Figure 3B:
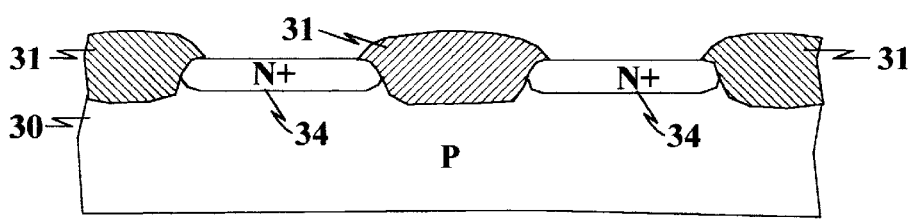
FIG. 3b is a cross-sectional view of the portion of the semiconductor substrate of FIG. 3a with P-N junctions formed in the active regions.

Turning now to FIGS. 3a–3j, which illustrate the fabrication method of the present invention, FIG. 3a shows the cross-section of a single crystalline P doped silicon substrate 30 having formed therein three isolation regions 31, herein LOCOS, although trench isolation also can be used. The LOCOS regions 31 isolate active regions having shallow junctions 34, as shown in FIG. 3b, containing N-type impurities, or alternatively P-type impurities, which have been implanted into silicon substrate and annealed by rapid thermal anneal to diffuse and activate the impurities and form shallow N+/P or P+/N junctions 34. The shallow junctions are less than about 2500 Å and, with arsenic (As) as the impurity, the desired depth of the N+/P shallow junctions can be projecting 500 Å for implant energies of 75 ke. In the case of shallow P+/N junctions, boron difluoride (BF$_2$) is used as the impurity and the desired depth can be achieved by projecting about 300 Å for implant energies of 50 ke. In the present instance, the depth of the N+/P shallow junction is about 1000 Å and the P+/N shallow junction is about 1200 Å from the silicon substrate surface.

Figure 3C:
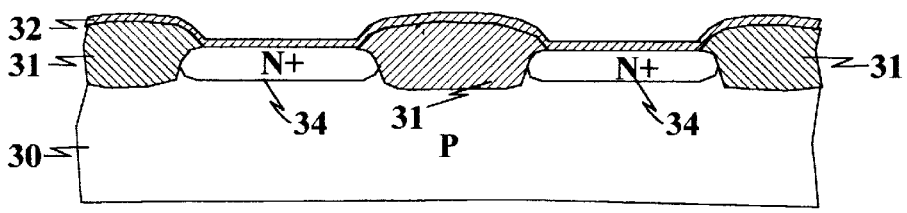
FIG. 3c is a is a cross-sectional view of the portion of the semiconductor substrate of FIG. 3b with a refractory metal layer deposited on semiconductor substrate surface over the isolation regions and the active regions.
Figure 3D:
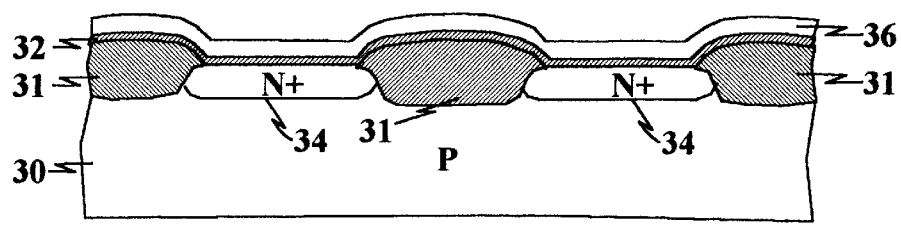
FIG. 3d is a cross-sectional view of the portion of the semiconductor substrate of FIG. 3c with a layer of a silicon containing material deposited on the refractory metal layer.
Figure 3E:
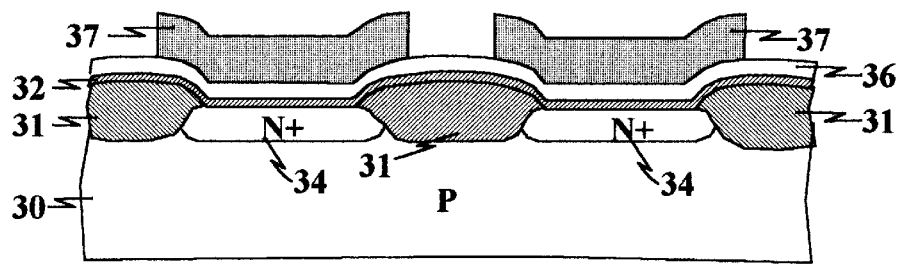
FIG. 3e is a cross-sectional view of the portion of the semiconductor substrate of FIG. 3d with resist layers masking the active regions.

Next, a refractory metal 32, herein titanium, or a Group VIII metal is sputter deposited, using conventional sputtering equipment and a titanium target, on the exposed silicon substrate surfaces and on top of the LOCOS to a thickness of about 300–400 Å as shown in FIG. 3c. Now, in accordance with the present invention, a silicon containing material 36 which silicates faster than single crystal silicon and which herein is amorphous silicon, is sputter deposited, using conventional sputtering equipment with a silicon target to a thickness of about 650 to 850 Å, as shown in FIG. 3e. Although amorphous silicon is the preferred silicon containing material, polycrystalline silicon also may be used.

In addition, the silicon containing material may be doped with an impurity since silicidation occurs less readily with doped amorphous and polysilicon than undoped amorphous silicon and polysilicon. By varying the doping of the amorphous silicon, silicidation reaction rate can be a parameter for controlling the amount of silicon (N+ for N+ source/drain or P+ for P+ source/drain) in the substrate. In this situation, the doping level in the amorphous silicon will determine the breakdown voltage of the fabricated silicided diode. For N+/P diodes, the amorphous silicon can be doped with an N-type impurity such as phorphous, arsenic, or antimony and, for P+/N diodes, the amorphous can be doped with boron or boron difluoride. With this aspect of the present invention, the amount of silicate from the amorphous silicon can be reduced so that more of the silicate results from the silicon substrate and, in this way, the depth of the shallow junction from the silicate can be varied.

Figure 3F:
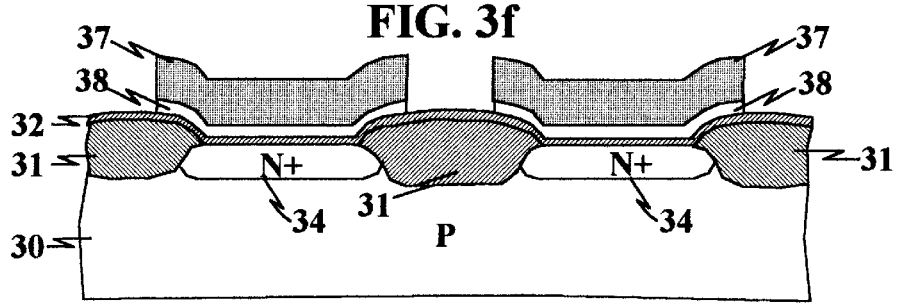
FIG. 3f is a cross-sectional view of the portion of the semiconductor substrate of FIG. 3e with silicon containing material removed from the unmasked areas over the isolation regions.
Figure 3G:
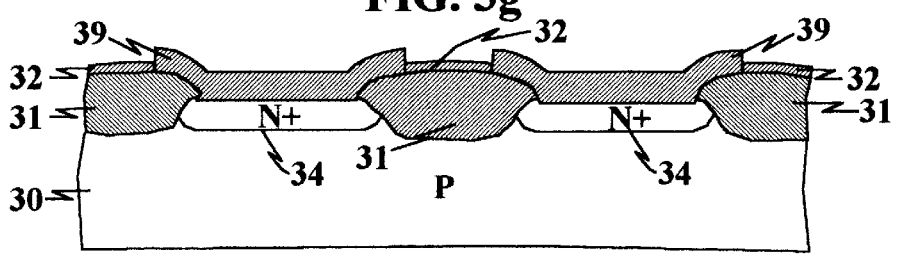
FIG. 3g is a cross-sectional view of the portion of the semiconductor substrate of FIG. 3f with the refractive metal reacted with the silicon containing material to form metal silicide over the active regions.
Figure 3H:
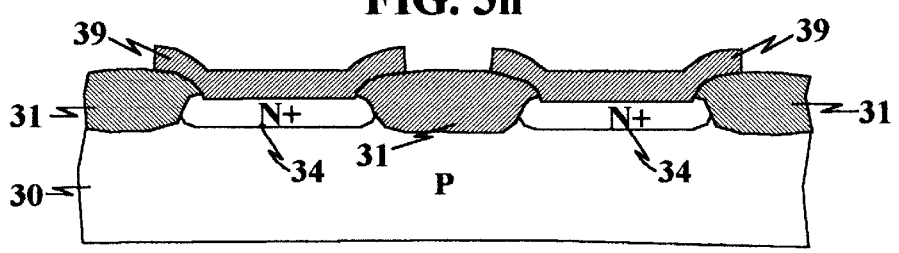
FIG. 3h is a cross-sectional view of the portion of the semiconductor substrate of FIG. 3g with the unreacted refractory metal removed from isolating regions.

Now, the active regions with the shallow junctions 34 are masked with a resist material 37 and the amorphous silicon is removed in the unmasked areas as shown in FIG. 3f. Preferably, the etchant gas to remove the amorphous silicon is carbon tetrafluoride with argon and nitrogen, which has a selectivity of 30:1 between amorphous silicon 36 and the underlying titanium 32. With the unmasked amorphous silicon removed, the resist mask 37 is removed, as shown in FIG. 3g and the substrate 30 is now subjected to a rapid thermal anneal at about 650° C. to cause the formation of titanium silicide 39 from the amorphous silicon 38 and the titanium 32, as shown in FIG. 3g. Because silicidation takes place much faster in amorphous silicon than single crystal silicon, most of titanium silicide forms above the original surface of the silicon substrate 30 and does not encroach on the shallow N+/P junctions 34 as shown in FIG. 3g. The silicidation is followed by using a selective etch to remove the titanium 32 over the LOCOS and then the substrate is subjected to another rapid thermal anneal at about 800° C. which converts the C49 phase of the silicide 39 into a much less resistive or more conductive and stable phase C54 of silicide 39 with the result being shown in FIG. 3h. Silicides of titanium, cobalt, platinum, palladium and nickel exhibit the lowest resistivities and they are 13–20, 16–18, 28–30, 30–35 and 5 Ω-cm.

Figure 3I:
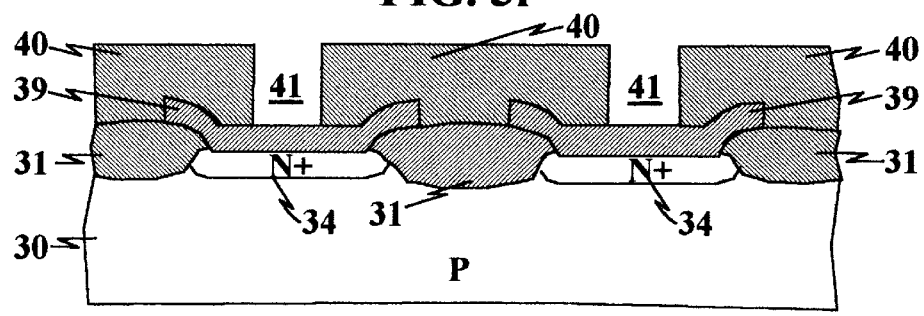
FIG. 3i is a cross-sectional view of the portion of the semiconductor substrate of FIG. 3h with an interlevel insulating layer having contact openings to the metal silicide of the active regions.
Figure 3J:
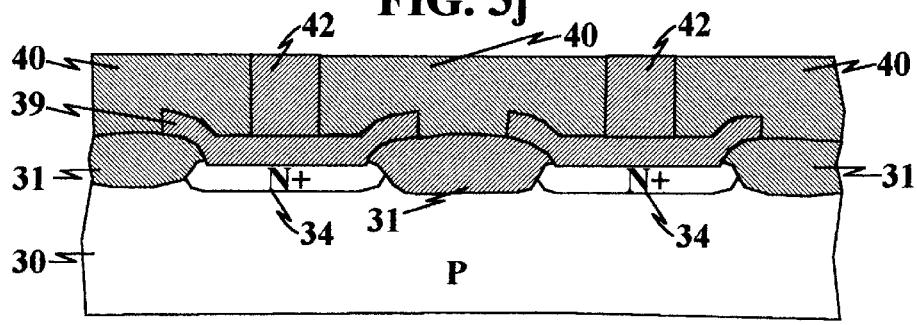
FIG. 3j is a cross-sectional view of the portion of the semiconductor substrate of FIG. 3i with the contact openings filled with a conductive material.

The remainder of the method of the present invention follows conventional practice as shown in FIGS. 3i and 3j with the deposition of an interlayer insulating layer 40, herein silicon oxide from a source of tetraethylothosilicate (TEOS), or alternatively tetramethylcyclotetrasiloxane (TMCTS), followed by planarization using preferably chemical/mechanical polish with a commercially available slurry. Contact opening 41 are plasma etched, using a reactive ion etcher with carbon tetrafluoride/hydrogen, in the insulating layer 40 as shown in FIG. 3i and filled with a conductive material 42, herein tungsten, as shown in FIG. 3j.

In the above described embodiment, both active areas were masked so that the titanium silicide did not encroach on either of the shallow junctions 34 and both would withstand high breakdown voltages. However, it is sometimes desirable to fabricate some shallow junctions with high breakdown voltages and other shallow junctions with low breakdown voltages on the same substrate. The method described in the embodiment shown in FIGS. 4a–4j achieves this result.

Figure 4A:
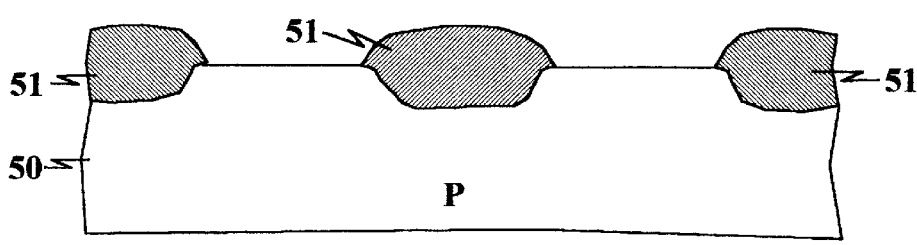
FIG. 4a is a cross-sectional view of the portion of a semiconductor substrate with isolation regions on opposite sides of a pair of active regions for diode formation as the starting point in describing another embodiment of the present invention.
Figure 4B:
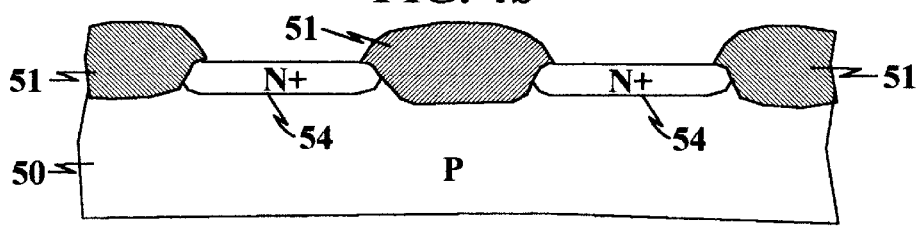
FIG. 4b is a cross-sectional view of the portion of the semiconductor substrate of FIG. 4a with P-N junctions formed in the active regions.

FIG. 4a again starts with a cross-section of a silicon substrate 50 having formed therein three isolation regions 51, herein LOCOS, although trench isolation also can be used. The LOCOS regions 51 isolate active regions having shallow junctions 54, as shown in FIG. 4b, containing N-type impurities, or P-type impurities, which have been implanted into silicon substrate and annealed by rapid thermal anneal to diffuse and activate the impurities and form shallow N+/P or P+/N junctions 54. Again, the shallow junctions are less than about 2500 Å and, with arsenic (As) as the impurity, the desired depth of the N+/P junctions can be achieved by projecting about 500 Å for implant energies of 75 ke. In the case of shallow P+/N junctions, boron difluoride (BF$_2$) is used as the impurity and the desired depth can be achieved by projecting about 300 Å for implant energies of 50 ke.Å. In the present instance, the depth of the N+/P shallow junction is about 1000 Å and the P+/N shallow junction is about 1200 Å from the silicon substrate surface.

Figure 4C:
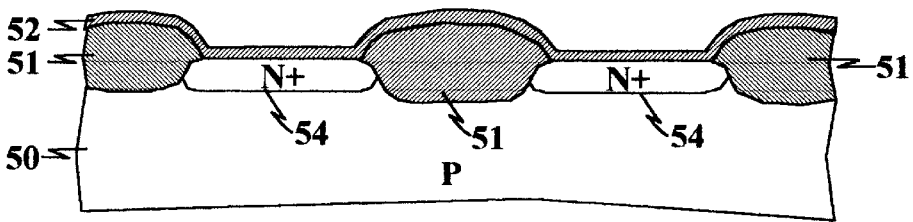
FIG. 4c is a is a cross-sectional view of the portion of the semiconductor substrate of FIG. 4b with a refractory metal layer deposited on semiconductor substrate surface over the isolation regions and the active regions.
Figure 4D:
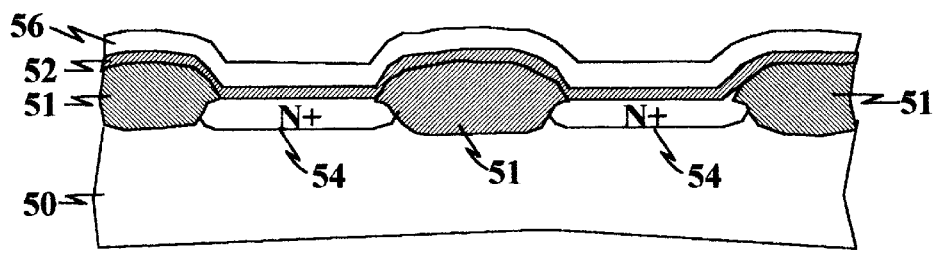
FIG. 4d is a cross-sectional view of the portion of the semiconductor substrate of FIG. 4c with a layer of a silicon containing material deposited on the refractory metal layer.
Figure 4E:
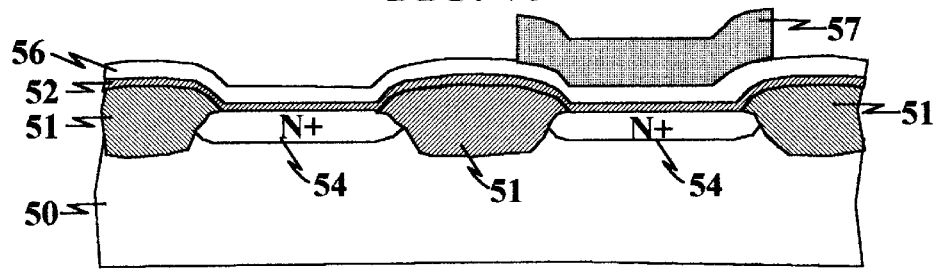
FIG. 4e is a cross-sectional view of the portion of the semiconductor substrate of FIG. 4d with resist layers masking one of the active regions.
Figure 4F:
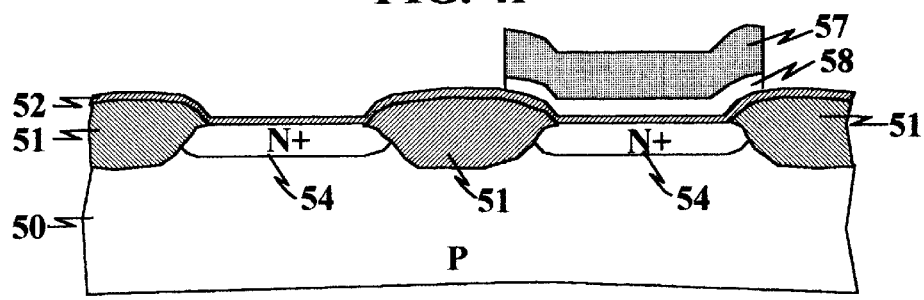
FIG. 4f is a cross-sectional view of the portion of the semiconductor substrate of FIG. 4e with silicon containing material removed from the unmasked areas over the isolation regions and the other active region.
Figure 4G:
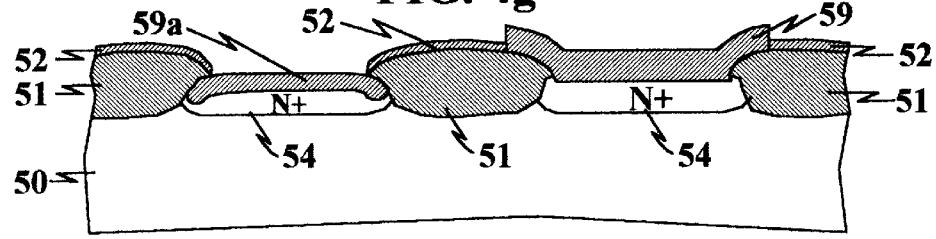
FIG. 4g is a cross-sectional view of the portion of the semiconductor substrate of FIG. 4f with the refractive metal reacted with the silicon containing material to form the metal silicide structure of the present invention over the one active region and the prior art metal silicide structure over the other active region.
Figure 4H:
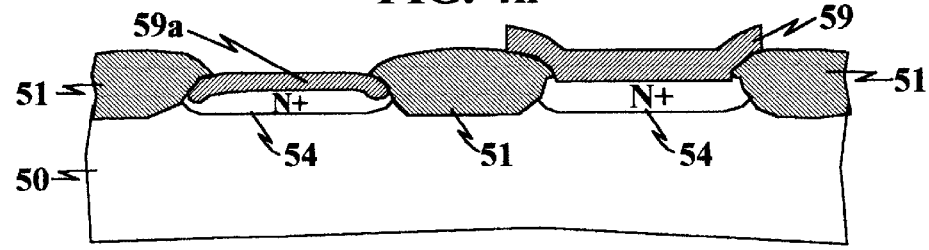
FIG. 4h is a cross-sectional view of the portion of the semiconductor substrate of FIG. 4g with the unreacted refractory metal removed from the isolation regions.

Next, a refractory metal 52, herein titanium, is sputter deposited, using conventional sputtering equipment and a titanium target, on the exposed silicon substrate surfaces and on top of the LOCOS to a thickness of about 300–400 Å as shown in FIG. 4c. Now, in accordance with the present invention, a silicon containing material 56 which silicates faster than single crystal silicon and which herein is amorphous silicon is sputter deposited, using conventional sputter equipment with a silicon target, to a thickness of about 650 to 850 Å, as shown in FIG. 4d. Although amorphous silicon is the preferred silicon material, polycrystalline silicon also may be used. In addition, the silicon containing material may be doped with an impurity since silicidation occurs less readily with doped amorphous silicon or polysilicon than undoped amorphous silicon or polysilicon and can be used as a parameter to control the amount of silicidation. In contrast to the previously described embodiment, only one of the two active regions with the shallow junctions 54 are masked with a resist material 57 and the amorphous silicon is removed in the unmasked areas including over the unmasked active region as shown in FIG. 4f. Preferably, the etchant gas to remove the amorphous silicon is carbon tetrafluoride with argon and nitrogen, which has a selectivity of 30:1 between amorphous silicon 56 and the underlying titanium 52. With the unmasked amorphous silicon removed, the resist mask 57 is removed, as shown in FIG. 4g and the substrate 30 is now subjected to a rapid thermal anneal at about 650° C. to cause the formation of titanium silicide 59 from the amorphous silicon 58 and the titanium 52, as shown in FIG. 4g. Because silicidation takes place much faster in amorphous silicon than single crystal silicon, most of titanium silicide forms above the original surface of the silicon substrate 30 and does not encroach on the shallow N+/P junctions 54 as shown in FIG. 4g. However, the titanium silicide 59a which forms in the active region without any amorphous silicon reacts totally with the silicon of the silicon substrate and encroaches on the shallow junction as shown in FIG. 4g. The C49 silicidation is followed by using a selective isotropic wet etch with a solution j of such as $NH_4OH:H_2O_2:H_2O$ to remove the unreacted titanium 32 over the LOCOS and then the substrate is subjected to another rapid thermal anneal at about 800° C. which converts the C49 phase of the silicide 59 and 59a into a much less resistive or more conductive and stable phase C54 of silicide 59 and 59a with the result being shown in FIG. 4h.

The remainder of this alternative embodiment of the method of the present invention follows conventional practice as shown in FIGS. 4i and 4j with the deposition of an interlayer insulating layer 60, herein silicon oxide from a source of TEOS, or alternatively TMCTS, followed by planarization using preferably chemical/mechanical polish with a commercially available slurry. Contact opening 61 are plasma etched, using a reactive ion etcher with carbon tetrafluoride/hydrogen as the etchant gas, in the insulating layer 60 as shown in FIG. 4i and filled with a conductive material 62, herein tungsten, as shown in FIG. 4j. With this embodiment, the titanium silicide layer 59 diode exhibits a high breakdown voltage and low leakage currents and the titanium silicide layer 59a diode exhibits low breakdown voltage and high leakage currents so that both types of diode can be fabricated in an integrated circuit with shallow junctions.

Moveover, if desired, the breakdown voltage can be varied for a number of selected diodes by using the alternative embodiment of the present invention. P+/N or N+/P diodes with isolation edges at the periphery of the diodes exhibit an increase of more than 1 volt in breakdown voltages (measured at 10 na and 10 $\mu$A) with the method of the present invention and the conventional method. There are a number of reasons for this difference. With the method of the present invention, the junction depth is increased from the titanium silicide at the surface of the silicon substrate. For example, with thicknesses of 400 and 440 Å of titanium, the P+/N junction depth from titanium silicide is increased by 600 and 500 Å, respectively. In addition, the doping concentration of the lightly doped regions of the shallow junctions are lower for diodes fabricated with the method of the present invention. Finally, the total charge Q in the heavily doped regions of the shallow junctions are higher for diodes fabricated by the method of the present invention.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. In an integrated circuit in and on a silicon substrate having a first active region including at least a pair of diodes each with a shallow junction to which a conductive contact is made comprising:

a single crystalline silicon substrate with an upper surface region;

a first shallow junction of a first diode and a second shallow junction of a second diode underlying said upper surface region; and a metal silicide layer having a lower surface disposed on said silicon substrate over said first and second shallow junctions, said metal silicide layer over said first shallow junction having its lower surface at the upper surface of said silicon substrate and said metal silicide layer over said second shallow junction having its lower surface below the upper surface of the silicon and closer in distance to its shallow junction than the metal silicide of the first shallow junction.

2. The integrated circuit of claim 1 wherein the metal silicide is titanium silicide comprising C54 phase.

3. The integrated circuit of claim 1 wherein the first diode exhibits high voltage breakdown and low leakage currents.

4. The integrated circuit of claim 1 wherein the second diode exhibits low voltage breakdown and high leakage currents.

5. The integrated circuit of claim 1 wherein depths of the shallow junctions are less than about 2500 Å.

6. The integrated circuit of claim 5 wherein the shallow junctions are N+/P junctions and said depths from the silicon substrate surface are of about 1000 Å.

7. The integrated circuit of claim 5 wherein the shallow junctions are P+/N junctions and said depths from the silicon substrate surface are of about 1200 Å.

* * * * *